United States Patent
Xu et al.

(10) Patent No.: US 10,200,152 B2
(45) Date of Patent: Feb. 5, 2019

(54) METHOD AND DEVICE FOR TRANSMITTING DATA USING LDPC CODE

(71) Applicant: BEIJING SPREADTRUM HI-TECH COMMUNICATIONS TECHNOLOGY CO., LTD., Beijing (CN)

(72) Inventors: Zhikun Xu, Shanghai (CN); Su Huang, Shanghai (CN); Zhengang Pan, Shanghai (CN)

(73) Assignee: BEIJING SPREADTRUM HI-TECH COMMUNICATIONS TECHNOLOGY CO., LTD., Beijing (CN)

( * ) Notice: Subject to any disclaimer, the term of this patent is extended or adjusted under 35 U.S.C. 154(b) by 17 days.

(21) Appl. No.: 15/406,060

(22) Filed: Jan. 13, 2017

(65) Prior Publication Data
US 2018/0097581 A1 Apr. 5, 2018

(30) Foreign Application Priority Data
Sep. 30, 2016 (CN) .......................... 2016 1 0877201

(51) Int. Cl.
*H04L 1/00* (2006.01)
*H03M 13/09* (2006.01)
(Continued)

(52) U.S. Cl.
CPC .......... *H04L 1/0042* (2013.01); *H03M 13/09* (2013.01); *H03M 13/1102* (2013.01);
(Continued)

(58) Field of Classification Search
CPC ............. H03M 13/09; H03M 13/1102; H03M 13/1105; H03M 13/2906; H03M 13/2927;
(Continued)

(56) References Cited

U.S. PATENT DOCUMENTS

2009/0210767 A1* 8/2009 Myung ............... H03M 13/033
714/752
2013/0198581 A1* 8/2013 Lee ..................... H03M 13/1117
714/752

(Continued)

FOREIGN PATENT DOCUMENTS

CN 101076946 A 11/2007
CN 101340262 A 1/2009
(Continued)

OTHER PUBLICATIONS

Nokia, Alcatel-Lucent Shanghai Bell, Performance of mMTC and URLLC channel coding candidates, 3GPP TSG-RAN WG1#86 R1-167271 Gothenburg, Sweden, Aug. 22-26, 2016; pp. 1-24.
(Continued)

Primary Examiner — Freshteh N Aghdam
(74) Attorney, Agent, or Firm — Cantor Colburn LLP (57) ABSTRACT

The present disclosure provides a method and a device for transmitting data using a LDPC code. The method for transmitting data using a LDPC code includes: determining a check code length according to a current LDPC code rate; informing a receiving end about the current LDPC code rate and the check code length, adding a check code with the check code length to data to be sent, and implementing a LDPC encoding using the current LDPC code rate, so as to obtain LDPC code data; and sending the LDPC code data to a receiving end. The method and the device of the present disclosure can improve spectrum effectiveness of transmitting data using LDPC code.

14 Claims, 4 Drawing Sheets

(51) Int. Cl.
   *H03M 13/11* (2006.01)
   *H03M 13/29* (2006.01)
   *H03M 13/31* (2006.01)
   *H03M 13/00* (2006.01)

(52) U.S. Cl.
   CPC ... *H03M 13/1105* (2013.01); *H03M 13/2906* (2013.01); *H03M 13/2927* (2013.01); *H03M 13/31* (2013.01); *H03M 13/63* (2013.01); *H04L 1/0009* (2013.01); *H04L 1/0061* (2013.01); *H04L 1/0075* (2013.01); *H04L 1/0002* (2013.01); *H04L 1/0025* (2013.01); *H04L 1/0057* (2013.01)

(58) Field of Classification Search
   CPC ..... H03M 13/31; H03M 13/63; H04L 1/0009; H04L 1/0042; H04L 1/0061; H04L 1/0075; H04L 1/0002; H04L 1/0025; H04L 1/0057
   See application file for complete search history.

(56) References Cited

U.S. PATENT DOCUMENTS

2014/0331102 A1* 11/2014 Lee .................. H03M 13/1105
                                                           714/758
2015/0128013 A1* 5/2015 Okamura ........... H03M 13/1117
                                                           714/776
2016/0204807 A1* 7/2016 Murakami ......... H03M 13/1154
                                                           714/776
2017/0170925 A1   6/2017 Xu et al.

FOREIGN PATENT DOCUMENTS

CN      101577554 A    11/2009
CN      105306165 A     2/2016

OTHER PUBLICATIONS

NTT Docomo, Inc., Study on New Radio Access Technology, 3GPP TSG RAN Meeting #73 RP-161597 New Orleans, USA, Sep. 19-22, 2016; pp. 1-84.

SIPO First Office Action for corresponding CN Application No. 201610877201.9; dated May 17, 2018.

* cited by examiner

METHOD AND DEVICE FOR TRANSMITTING DATA USING LDPC CODE

CROSS-REFERENCE TO RELATED APPLICATIONS

This application claims the benefit of priority to Chinese Patent Application No. 201610877201.9, filed on Sep. 30, 2016, and entitled "METHOD AND DEVICE FOR TRANSMITTING DATA USING LDPC CODE", and the entire disclosure of which is incorporated herein by reference.

TECHNICAL FIELD

The present disclosure generally relates to communication technical field, and more particularly, to a method and a device for transmitting data using a LDPC code.

BACKGROUND

A LDPC (Low Density Parity Check) code is a linear error correcting code and is another important code after the Turbo code. A check matrix of the LDPC has a property of sparse, thus an encoding method and a decoding method of the LDPC are not complex. Moreover, a decoding of the LDPC has a property of parallel which is in favor of designing a high-throughput decoder. The LDPC possesses properties, such as good flexibility, low error probability and high throughput, therefore, the LDPC has been adopted by various standards, such as the IEEE802.11n and the DVB-S2 standards.

However, there is a problem of low spectrum efficiency in existing methods for transmitting data using LDPC code.

SUMMARY

Embodiments of the present disclosure provide a method for improving spectrum efficiency in transmitting data using a LDPC code.

The present disclosure provides a method for transmitting data using a LDPC code, including: determining a check code length according to a current LDPC code rate; informing a receiving end about the current LDPC code rate and the check code length, adding a check code with the check code length to data to be sent, and implementing a LDPC encoding using the current LDPC code rate, so as to obtain LDPC code data; and sending the LDPC code data to a receiving end.

In some embodiments, determining a check code length according to a current LDPC code rate includes: deciding a value range of the current LDPC code rate; and determining the heck code length according to the value range.

In some embodiments, the transmitting end is configured with M kinds of LDPC code rate; and a number of bit occupied by informing the receiving end about the current LDPC code rate and the check code length is $\lceil \log_2^M \rceil$, where M is an integer greater than or equal to two.

In some embodiments, determining a check code length according to a current LDPC code rate includes: deciding a value range of the current LDPC code rate; and selecting the check code length from a length group corresponding to the value range.

In some embodiments, the transmitting end is configured with M kinds of LDPC code rate; in a length group corresponding to a $m^{th}$ code rate, there are $K_m$ alternative check code lengths; and a number of bit occupied by informing the receiving end about the current LDPC code rate and the check code length is $$\lceil \log_2^M \rceil + \left\lceil \sum_{m=1}^{M} \log_2^{K_m} \right\rceil,$$

where M is an integer greater than or equal to two, and m is an integer between one and M.

In some embodiments, the check code is a CRC code.

In some embodiments, the current LDPC code rate is determined according to a channel state between the transmitting end and the receiving end.

Embodiments of the present disclosure further provides a method for transmitting data using a LDPC code, including: obtaining from a transmitting end a current LDPC code rate and a check code length, where the check code length is determined by the transmitting end according to the current LDPC code rate; receiving LDPC code data from the transmitting end, where the LDPC code data includes data to be sent and a check code with the check code length; and implementing a decoding to the LDPC code data using the current LDPC code rate, and implementing a checking to the data to be sent using the check code with the check code length.

In some embodiments, the check code is a CRC code.

In some embodiments, the current LDPC code rate is determined according to a channel state between the transmitting end and the receiving end.

Embodiments of the present disclosure further provides a device for transmitting data using a LDPC code, including: a check code length determining circuitry configured to determine a check code length according to a current LDPC code rate; an informing circuitry configured to inform a receiving end about the current LDPC code rate and the check code length; a data circuitry configured to add a check code with the check code length to data to be sent, and implement a LDPC encoding using the current LDPC code rate, so as to obtain LDPC code data; and a sending circuitry configured to send the LDPC code data to a receiving end.

In some embodiments, the check code length determining circuitry includes: a first range deciding sub-circuitry configured to decide a value range of the current LDPC code rate; and a first determining sub-circuitry configured to determine the check code length according to the value range.

In some embodiments, the transmitting end is configured with M kinds of LDPC code rate; and the informing circuitry uses $\lceil \log_2^M \rceil$ bit to inform the receiving end, where M is an integer greater than or equal to two.

In some embodiments, the check code length determining circuitry includes: a second deciding sub-circuitry configured to decide a value range of the current LDPC code rate; and a second determining circuitry configured to select the check code length from a length group corresponding to the value range.

In some embodiments, the transmitting end is configured with M kinds of LDPC code rate; in a length group corresponding to a $m^{th}$ code rate, there are $K_m$ alternative check code lengths; and the informing circuitry uses $$\lceil \log_2^M \rceil + \left\lceil \sum_{m=1}^{M} \log_2^{K_m} \right\rceil$$

bit to inform the receiving end, where M is an integer greater than or equal to two, and m is an integer between one and M.

In some embodiments, the check code is a CRC code.

In some embodiments, the current LDPC code rate is determined according to a channel state between the transmitting end and the receiving end.

Embodiments of the present disclosure further provides a device for transmitting data using a LDPC code, including: a length obtaining circuitry configured to obtain from a transmitting end a current LDPC code rate and a check code length, wherein the check code length is determined by the transmitting end according to the current LDPC code rate; a receiving circuitry configured to receive LDPC code data from the transmitting end, where the LDPC code data includes data to be sent and a check code with the check code length; and a checking circuitry configured to implement a decoding to the LDPC code data using the current LDPC code rate, and implement a checking to the data to be sent using the check code with the check code length.

In some embodiments, the check code is a CRC code.

In some embodiments, the current LDPC code rate is determined according to a channel state between the transmitting end and the receiving end.

In comparison with exiting technologies, the technical solution according to embodiment of the present disclosure possess following advantages:

In embodiments of the present disclosure, a check code length is determined according to a current LDPC code rate, and a receiving end is informed about the check code length determined, so that the receiving end can receive LDPC code data from the a transmitting end, implement a decoding to the LDPC code data using the current LDPC code rate, and implement a checking to data to be sent using a check code with the check code length. Since the check code length is determined according to the current LDPC code rate, the check code length matches with the LDPC code rate. Therefore, waste of spectrum resource caused by an overlong check code can be avoided, and spectrum efficiency of the method for transmitting data using LDPC code can be further improved.

DETAILED DESCRIPTION

As recited in the background, existing methods for transmitting data using a LDPC code have a problem of low in spectrum efficiency.

Through research, the inventors of the present disclosure find out that: in a method for transmitting data using a LDPC code, it usually needs to add a check code in data to be sent, so that a receiving end can implement a checking process to the data to be sent. In existing methods for transmitting data using a LDPC code, usually a check code with a fixed length is added to the data to be sent. For example, the IEEE 802.11n standard specifies that, the data to be sent is added with a 32 bit CRC (Cyclic Redundancy Check) code; and the DVB-S2 standard specifies that, the data to be sent is added with an 8 bit CRC code.

The LDPC itself possesses a checking property, and the checking property is better when a code rate of the LDPC is low. However, in existing technologies, the length of the check code added to the data to be sent is fixed, thus the checking property possessed by the LDPC itself is not fully used. Therefore, spectrum resource is wasted and spectrum efficiency is low.

In embodiments of the present disclosure, a check code length is determined according to a current LDPC code rate, and a receiving end is informed about the check code length determined, so that the receiving end can receive LDPC code data from the a transmitting end, implement a decoding to the LDPC code data using the current LDPC code rate, and implement a checking to data to be sent using a check code with the check code length. Since the check code length is determined according to the current LDPC code rate, the check code length matches with the LDPC code rate. Therefore, the checking property possessed by the LDPC code itself can be fully used, waste of the spectrum resource caused by a too long check code can be avoided, and the spectrum efficiency of the method for transmitting data using LDPC code can be further improved.

In order to make above recited objectives, features and advantages of the present disclosure clear and easy to understand, embodiments of the present disclosure will be illustrated in detailed as follow in combination with corresponding drawings.

Figure 1:
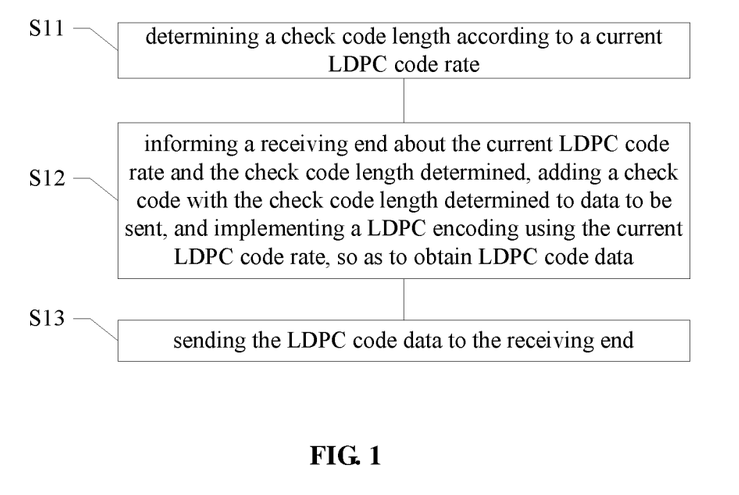
FIG. 1 schematically illustrates a flow chart of a method for transmitting data using a LDPC code according to one embodiment of the present disclosure.

FIG. 1 is a is a flow chart of a method for transmitting data using a LDPC code according to one embodiment of the present disclosure, which includes following steps from S11 to S14.

In step S11: determining a check code length according to a current LDPC code rate.

In step S12: informing a receiving end about the current LDPC code rate and the check code length determined, adding a check code with the check code length determined to data to be sent, and implementing a LDPC encoding using the current LDPC code rate, so as to obtain LDPC code data.

In step S13: sending the LDPC code data to the receiving end.

Wherein, the LDPC code rate refers to a code rate of the LDPC code. Under a condition that the code rate of the LDPC code is low, a number of check bit of the LDOC code itself is great, a checking effectiveness is good, and a length of a check code needed to be additionally added to the data to be sent is short. On the contrary, under a condition that the code rate of the LDPC code is high, the length of the check code needed to be additionally added to the data to be sent is long. In short, the higher the code rate is, the longer the check code is.

Accordingly, through determining the check code length according to the current LDPC code rate, a waste of spectrum resource, caused by adding a too long check code when the LDPC itself has good check effectiveness, can be avoided. Since the check code length is determined according to the current LDPC code rate, the check code length matches with the current code rate of the LDPC code, thus it realizes an appropriate compromise between a low false dismissal probability and a low overhead of high spectrum efficiency.

The check code as recited in embodiments of the present disclosure is a check code additionally added to the data to be sent, for example, the check code may be a CRC (Cyclic Redundancy Check) code.

Those skilled in the art can understand that, if a preset check effectiveness can be realized by only relying on the LDPC code under the current LDPC code rate, the check code length may be zero, that is to say, there is no need of additionally adding a check code.

In some embodiments, the current LDPC code rate is determined according to a channel state between the transmitting end and the receiving end.

The LDPC encoding method in embodiments of the present disclosure can be applied to various communication scenarios. For example, the transmitting end may be a network side, the receiving end may be a user terminal; both the transmitting end and the receiving end may be a user terminal; or the transmitting end is a user terminal, the receiving end is a network side.

Figure 2:
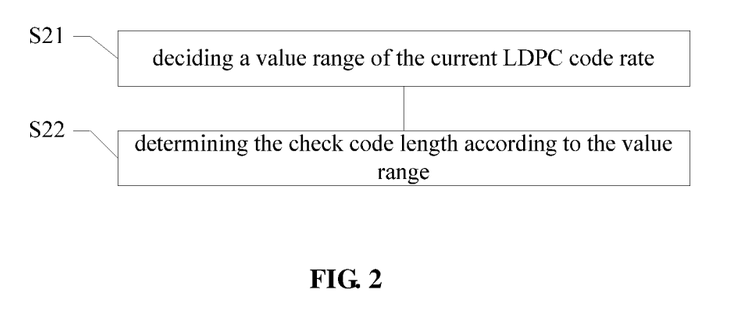
FIG. 2 schematically illustrates a flow chart of S11 in FIG. 1 according to one embodiment of the present disclosure.

FIG. 2 is a flow chart of the step S11 in FIG. 1 according to one embodiment of the present disclosure. The step S11 will be described in detail in combination with FIG. 2. The step S11 may include following steps from S21 to S22.

In step S21: deciding a value range of the current LDPC code rate.

In step S22: determining the check code length according to the value range.

In some embodiments, according to practical requirements, the LDPC code rate R may be divided into different value ranges. A value of an endpoint of each value range may be set according to a simulation experimental result or an empirical value.

In some embodiments, each value range may only correspond to one check code length, thus the check code length can be directly determined according to the value range. Similar to the division of the LDPC code rate, a corresponding relation between the value range and the check code length may be set according to a simulation experimental result or an empirical value.

For example, the check code may be a CRC code. When the LDPC code rate R meets a relation of R<R1, a CRC code with a length of L1 is applied; when the LDPC code rate R meets a relation of R1<R<R2, a CRC code with a length of L2 is applied; and when the LDPC code rate R meets a relation of R>R2, a CRC code with a length of L3 is applied; wherein R1, R2 and R3 are preset code rates, L1, L2 and L3 are preset lengths. L1, L2 and L3 are different from each other. In some embodiments, values of L1, L2 and L3 gradually increase from L1 to L3. In an exemplary embodiment, the values of L1, L2 and L3 are respectively 8, 16 and 24.

In some embodiments of the present disclosure, the transmitting end can support M kinds of LDPC code rate, and the transmitting end can inform the receiving end about the current LDPC code rate and a bounded check code using $\lceil \log_2^M \rceil$ bit. In this case, both the transmitting end and the receiving end store initial positions of the different value ranges, and check code lengths corresponding to the different value ranges. Therefore, the transmitting end only needs $\lceil \log_2^M \rceil$ bit to inform the receiving end. The receiving end can decide the value range of the current code rate according to the current code rate, and seek the check code length corresponding to the value range, so as to learn the current LDPC code rate and the bounded check code.

Figure 3:
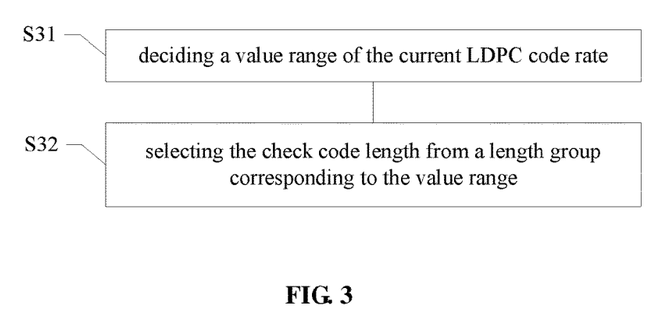
FIG. 3 schematically illustrates a flow chart of S11 in FIG. 1 according to another embodiment of the present disclosure.

FIG. 3 is a flow chart of the step S11 in FIG. 1 according to another embodiment of the present disclosure. The step S11 will be described in detail in combination with FIG. 3. The step S11 may include following steps from S31 to S32.

In step S31: deciding a value range of the current LDPC code rate.

In step S32: selecting the check code length from a length group corresponding to the value range.

In some embodiments, different value ranges correspond to different length groups. For example, when the LDPC code rate R meets a relation of R<R1, the check code length is selected from a first length group; when the LDPC code rate R meets a relation of R1<R<R2, the check code length is selected from a second length group; and when the LDPC code rate R meets a relation of R>R2, the check code length is selected from a third length group.

When selecting the check code length from the length group, the selecting process can be implemented in consideration of following factors: a distance between the receiving end and the transmitting end, a signal processing requirement of the receiving end, etc.

In an exemplary embodiment, the check code may be a CRC code, the first length group may include values of 2, 4, 6 and 8, the second length group may include values of 10, 12, 14 and 16, and the third length group may include values of 18, 20, 22 and 24.

In some embodiments, if the transmitting end can support M kinds of LDPC code rate; in a length group corresponding to a $m^{th}$ code rate, there are $K_m$ alternative check code lengths, where M is an integer greater than or equal to 2, and m is an integer between 1 and M; and the LDPC code rate can be divided into N value ranges, then the transmitting end can inform the receiving end about the current LDPC code rate and a bounded check code using $$\left\lceil \log_2^M + \sum^M \log_2^{K_m} \right\rceil$$

bit.

In this case, both the transmitting end and the receiving end store initial positions of the different value ranges, and length groups of different check codes corresponding to different value ranges, thus the transmitting end needs to inform the receiving end using $$\left\lceil \log_2^M + \sum^M \log_2^{K_m} \right\rceil$$

bit. The receiving end can decide a value range of the current code rate according to the current code rate, seek the length group of the check code corresponding to the value range, so as to learn about the current LDPC code rate and the bounded check code according to the inform of the transmitting end.

In some embodiments of the present disclosure, the transmitting end is configured with M kinds of LDPC code rate, in a length group corresponding to a $m^{th}$ code rate, there are $K_m$ alternative check code lengths, a number of bit occupied by informing the receiving end about the current LDPC code rate and the check code length is $$\lceil \log_2^M \rceil + \left\lceil \sum_{m=1}^{M} \log_2^{K_m} \right\rceil,$$

where M is an integer greater than or equal to 2, and m is an integer between 1 and M.

Accordingly, the above recited method does not implement a division to the current code rate, and multiple alternative check code lengths are set to correspond to each code rate, thus the length of the code rate can be configured more precisely, so as to further improve the using efficiency of the spectrum resource.

Accordingly, in embodiments of the present disclosure, the check code length is determined according to the current LDPC code rate, and a receiving end is informed about the check code length determined, so that the receiving end can receive LDPC code data from the a transmitting end, implement a decoding to the LDPC code data using the current LDPC code rate, and implement a checking to data to be sent using a check code with the check code length determined. Since the check code length is determined according to the current LDPC code rate, the check code length matches with the LDPC code rate. Therefore, the checking property possessed by the LDPC code itself can be fully used, waste of the spectrum resource caused by an overlong check code can be avoided, and the spectrum efficiency of the method for transmitting data using LDPC code can be further improved.

Figure 4:
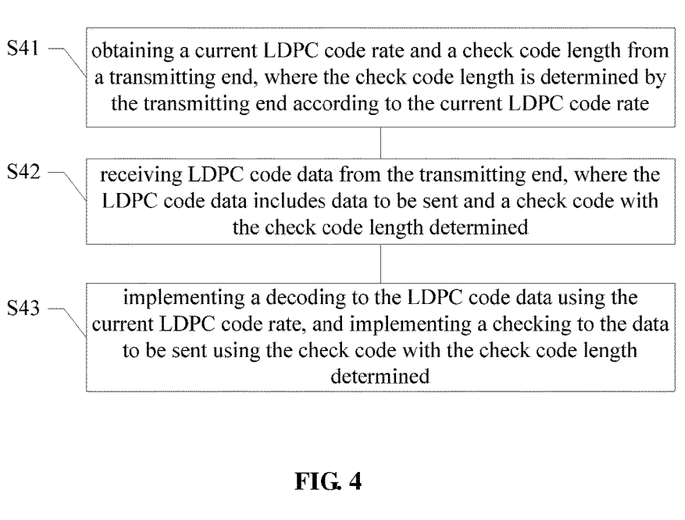
FIG. 4 schematically illustrates a flow chart of a method for transmitting data using a LDPC code according to another embodiment of the present disclosure.

Embodiment of the present disclosure further provides another method for transmitting data using a LDPC code, which can be applied in a receiving end. A flow chart of the method is shown in FIG. 4, which include the following steps from S41 to S43.

In step S41: obtaining a current LDPC code rate and a check code length from a transmitting end, where the check code length is determined by the transmitting end according to the current LDPC code rate.

In step S42: receiving LDPC code data from the transmitting end, where the LDPC code data includes data to be sent and a check code with the check code length determined.

In step S43: implementing a decoding to the LDPC code data using the current LDPC code rate, and implementing a checking to the data to be sent using the check code with the check code length determined.

Wherein, the check code may be a CRC code, the current LDPC code rate may be determined according to a channel state between the transmitting end and the receiving end.

A process of the transmitting end determining the check code length according to the current LDPC code rate can refer to corresponding descriptions of the method for transmitting data using a LDPC code that can be applied to the transmitting end, which will not be described in detail herein.

Embodiment of the present disclosure further provides a device for transmitting data using a LDPC code, which can be applied in a transmitting end. A structure of the device is shown in FIG. 5.

The device for transmitting data using a LDPC code may include: a check code length determining circuitry 51 configured to determine a check code length according to a current LDPC code rate; an informing circuitry 52 configured to inform a receiving end about the current LDPC code rate and the check code length; a data circuitry 53 configured to add a check code with the check code length determined to data to be sent, and implement a LDPC encoding using the current LDPC code rate, so as to obtain LDPC code data; and a sending circuitry 54 configured to send the LDPC code data to the receiving end.

Figure 5:
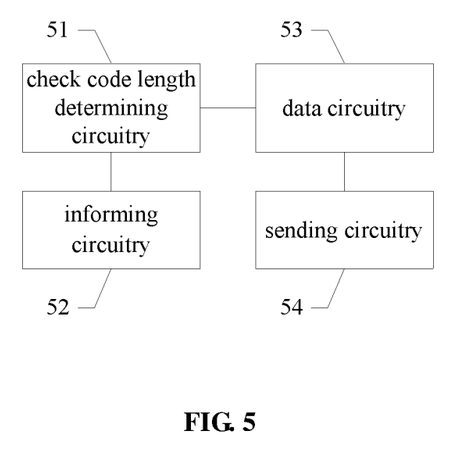
FIG. 5 schematically illustrates a structure of a device for transmitting data using a LDPC code according to one embodiment of the present disclosure.
Figure 6:
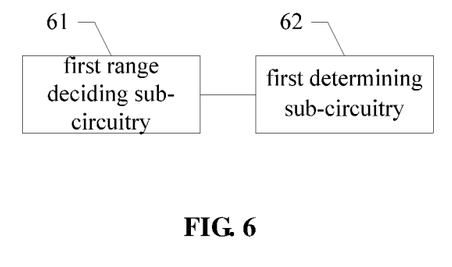
FIG. 6 schematically illustrates a structure of the check code length determining circuitry 51 in FIG. 5.

Referring to FIG. 6, the check code length determining circuitry 51 in FIG. 5 may include: a first range deciding sub-circuitry 61 and a first determining sub-circuitry 62.

The first range deciding sub-circuitry 61 is configured to decide a value range of the current LDPC code rate.

The first determining sub-circuitry 62 is configured to determine the check code length according to the value range.

In some embodiments, the transmitting end may be configured to have M kinds of LDPC code rate, and the informing circuitry informs the receiving end using $\lceil \log_2^M \rceil$ bit, where M is an integer greater than or equal to 2.

Figure 7:
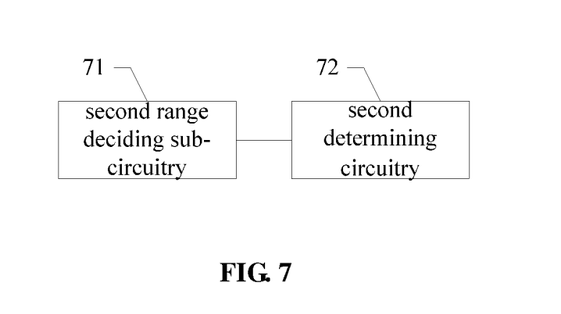
FIG. 7 schematically illustrates another structure of the check code length determining circuitry 51 in FIG. 5.

FIG. 7 is another structure of the check code length determining circuitry 51 in FIG. 5. The check code length determining circuitry 51 may include: a second range deciding sub-circuitry 71 and a second determining circuitry 72.

The first range deciding sub-circuitry 71 is configured to decide a value range of the current LDPC code rate.

The second determining circuitry 72 is configured to select the check code length from a length group corresponding to the value range.

In some embodiments of the present disclosure, the transmitting end is configured to have M kinds of LDPC code rate; in a length group corresponding to a $m^{th}$ code rate, there are $K_m$ alternative check code lengths; and the check code length determining circuitry 51 determines the check code length used from the $K_m$ alternative check code lengths according to the current code rate, the informing circuitry uses $$\lceil \log_2^M \rceil + \left\lceil \sum_{m=1}^{M} \log_2^{K_m} \right\rceil$$

bit to inform the receiving end, where M is an integer greater than or equal to 2, and m is an integer between 1 and M.

In some embodiments, the check code may be a CRC code, and the current LDPC code rate is determined according to a channel state between the transmitting end and the receiving end.

Specific realizing ways and advantages of the device for transmitting data using a LDPC code in the embodiments of the present disclosure can refer to corresponding descriptions of the method for transmitting data using a LDPC code that can be applied to the transmitting end, which will not be described in detail herein.

Figure 8:
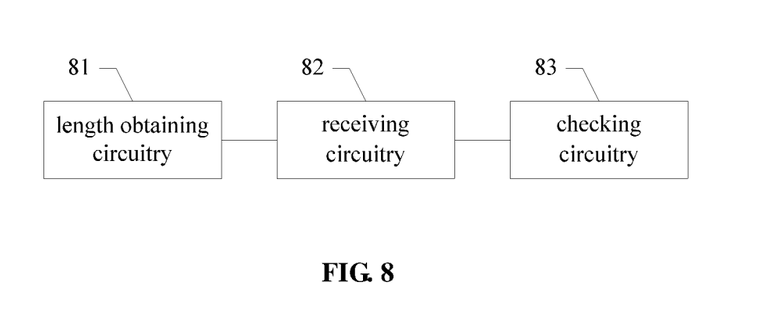
FIG. 8 schematically illustrates a structure of a device for transmitting data using a LDPC code according to another embodiment of the present disclosure.

Embodiment of the present disclosure further provides a device for transmitting data using a LDPC code, which can be applied to a receiving end. A structure of the device is shown in FIG. 8, while includes a length obtaining circuitry 81, a receiving circuitry 82 and a checking circuitry 83.

The length obtaining circuitry 81 is configured to obtain a current LDPC code rate and a check code length from a transmitting end, wherein the check code length is determined by the transmitting end according to the current LDPC code rate.

The receiving circuitry 82 is configured to receive LDPC code data from the transmitting end, wherein the LDPC code data include data to be sent and a check code with the check code length determined.

The checking circuitry 83 is configured to implement a decoding to the LDPC code data using the current LDPC code rate, and implement a checking to the data to be sent using the check code with the check code length determined.

In some embodiments, the check code may be a CRC code, and the current LDPC code rate is determined according to a channel state between the transmitting end and the receiving end.

Specific realizing ways and advantages of the device for transmitting data using a LDPC code in the embodiments of the present disclosure can refer to corresponding descriptions of the method for transmitting data using a LDPC code that can be applied to the receiving end, which will not be described in detail herein.

Those skilled in the art can understand that, all steps or some of the steps in various methods of above recited embodiments of the present disclosure can be accomplished by hardware under instruction of programs. The programs can be stored in a readable storage medium of a computer, wherein the storage medium may include: ROM (Read Only Memory), RAM (Random Access Memory), magnetic disk, light disk, etc.

Although the present disclosure has been disclosed above with reference to preferred embodiments thereof, it should be understood by those skilled in the art that various changes and modifications may be made without departing from the spirit or scope of the disclosure. Accordingly, the present disclosure covers changes and modifications made to the present disclosure that fall into scopes defined by the claims and equivalent technical solutions thereof.

The invention claimed is:

1. A method for transmitting data using a LDPC (Low Density Parity Check) code, being applied in a transmitting end and comprising:
   determining a check code length according to a current LDPC code rate;
   informing a receiving end about the current LDPC code rate and the check code length, adding a check code with the check code length to data to be sent, and implementing a LDPC encoding using the current LDPC code rate, so as to obtain LDPC code data; and
   sending the LDPC code data to a receiving end.

2. The method for transmitting data using a LDPC code according to claim 1, wherein determining a check code length according to a current LDPC code rate comprises:
   deciding a value range of the current LDPC code rate; and
   determining the check code length according to the value range.

3. The method for transmitting data using a LDPC code according to claim 2, wherein the transmitting end is configured with M kinds of LDPC code rate; and a number of bit occupied by informing the receiving end about the current LDPC code rate and the check code length is $\lceil \log_2^M \rceil$, where M is an integer greater than or equal to two.

4. The method for transmitting data using a LDPC code according to claim 1, wherein determining the check code length according to the current LDPC code rate comprises:
   deciding a value range of the current LDPC code rate; and
   selecting the check code length from a length group corresponding to the value range.

5. The method for transmitting data using a LDPC code according to claim 1, wherein the transmitting end is configured with M kinds of LDPC code rate; in a length group corresponding to a $m^{th}$ code rate, there are $K_m$ alternative check code lengths; and a number of bit occupied by informing the receiving end about the current LDPC code rate and the checkcode length is $$\lceil \log_2^M \rceil + \left\lceil \sum_{m=1}^{M} \log_2^{K_m} \right\rceil,$$

where M is an integer greater than or equal to two, and m is an integer between one and M.

6. The method for transmitting data using a LDPC code according to claim 1, wherein the check code is a cyclic redundancy check code.

7. The method for transmitting data using a LDPC code according to claim 1, wherein the current LDPC code rate is determined according to a channel state between the transmitting end and the receiving end.

8. A device for transmitting data using a LDPC (Low Density Parity Check) code, being applied in a transmitting end and comprising:
   a check code length determining circuitry configured to determine a check code length according to a current LDPC code rate;
   an informing circuitry configured to inform a receiving end about the current LDPC code rate and the check code length;
   a data circuitry configured to add a check code with the check code length to data to be sent, and implement a LDPC encoding using the current LDPC code rate, so as to obtain LDPC code data; and
   a sending circuitry configured to send the LDPC code data to a receiving end.

9. The device for transmitting data using a LDPC code according to claim 8, wherein the check code length determining circuitry comprises:
   a first range deciding sub-circuitry configured to decide a value range of the current LDPC code rate; and
   a first determining sub-circuitry configured to determine the check code length according to the value range.

10. The device for transmitting data using a LDPC code according to claim 9, wherein the transmitting end is configured with M kinds of LDPC code rate; and the informing circuitry uses $\lceil \log_2^M \rceil$ bit to inform the receiving end, where M is an integer greater than or equal to two.

11. The device for transmitting data using a LDPC code according to claim 8, wherein the check code length determining circuitry comprises:
   a second deciding sub-circuitry configured to decide a value range of the current LDPC code rate; and
   a second determining circuitry configured to select the check code length from a length group corresponding to the value range.

12. The device for transmitting data using a LDPC code according to claim 8, wherein the transmitting end is configured with M kinds of LDPC code rate; in a length group corresponding to a $m^{th}$ code rate, there are $K_m$ alternative check code lengths; and the informing circuitry uses $$\lceil \log_2^M \rceil + \left\lceil \sum_{m=1}^{M} \log_2^{K_m} \right\rceil$$

bit to inform the receiving end, where M is an integer greater than or equal to two, and m is an integer between one and M.

13. The device for transmitting data using a LDPC code according to claim 8, wherein the check code is a cyclic redundancy check code.

14. The device for transmitting data using a LDPC code according to claim 8, wherein the current LDPC code rate is determined according to a channel state between the transmitting end and the receiving end.

* * * * *